United States Patent
Pandey et al.

(10) Patent No.: US 9,673,831 B1
(45) Date of Patent: Jun. 6, 2017

(54) PASSIVE SWITCH HAVING LOW LEAKAGE CURRENT

(71) Applicant: NXP USA, INC., Austin, TX (US)

(72) Inventors: Luv Pandey, Noida, IN (US); Sanjoy Kumar Dey, Noida, IN (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/469,563

(22) Filed: Mar. 26, 2017

(51) Int. Cl.
*H03M 1/38* (2006.01)
*H03M 1/00* (2006.01)
*H03K 17/16* (2006.01)

(52) U.S. Cl.
CPC .......... *H03M 1/002* (2013.01); *H03K 17/161* (2013.01); *H03M 1/38* (2013.01)

(58) Field of Classification Search
CPC ......... H03M 1/002; H03M 1/68; H03M 1/161
USPC ................................. 341/166–161
See application file for complete search history.

(56) References Cited

U.S. PATENT DOCUMENTS

| | | | | |
|---|---|---|---|---|
| 4,128,787 A | * | 12/1978 | Bigelow | H01J 17/492 315/169.4 |
| 4,937,722 A | * | 6/1990 | Deierlein | H02M 3/156 323/285 |
| 5,984,513 A | * | 11/1999 | Baldwin | H05B 37/0227 307/116 |
| 7,646,653 B2 | | 1/2010 | Choi et al. | |
| 7,973,570 B2 | | 7/2011 | Pigott et al. | |
| 8,570,205 B2 | | 10/2013 | Sarraj et al. | |
| 2016/0277019 A1 | | 9/2016 | Cical et al. | |

* cited by examiner

*Primary Examiner* — Lam T Mai
(74) *Attorney, Agent, or Firm* — Charles E. Bergere

(57) ABSTRACT

In an analog-to-digital converter (ADC) having storage capacitors, passive top-plate switch circuitry has at least one diode-configured transistor connected between a first transistor and the top-plate node of the storage capacitors to provide a diode-voltage drop that ensures that the voltage at the node between two transistors is different from the top-plate node voltage in order to reduce GIDL/GISL leakage current through the first transistor that could adversely affect the ADC's digital output value. A corresponding capacitor is connected across each diode-configured device to reduce the amount of charge needed to achieve intermediate-node, steady-state voltages when the switch circuitry is off. In an n-type implementation, a reverse-diode-biased isolation device is connected between the top-plate node and the at least one diode-configured device to prevent the top-plate node from seeing the large dynamic junction capacitance of the at least one diode-configured device.

9 Claims, 4 Drawing Sheets

100

200

400

500

PASSIVE SWITCH HAVING LOW LEAKAGE CURRENT

BACKGROUND

The present invention relates to electronic switches and, more particularly, to electronic switches for switched capacitor circuitry used in analog-to-digital converters.

A successive-approximation-register (SAR) analog-to-digital converter (ADC) selectively stores analog input energy in storage capacitors and then successively taps that energy to convert an analog input voltage into a representative digital output value.

FIG. 1 is a schematic circuit diagram of a portion of a conventional 3-bit SAR ADC 100 having four storage capacitors Cs0, Cs1, Cs2, and Cs3 having relative capacitance levels of Cu, Cu, 2Cu, and 4Cu, respectively. The SAR ADC 100 also has top-plate sampling switch STP, four bottom-plate sampling switches Sin0-Sin3, and eight bottom-plate conversion switches Sw10-Sw13 and Sw20-Sw23. Note that the top plates of the four storage capacitors Cs0-Cs3 are all shorted together at top-plate node TP, while each storage capacitor Csi has its own distinct bottom-plate node Bpi.

The switch STP selectively connects the top-plate node to a common-mode reference voltage Vcm, the switches Sin0-Sin3 selectively connect the corresponding bottom-plate nodes BP0-BP3 to the input voltage Vin, the switches Sw10-Sw13 selectively connect the corresponding bottom-plate nodes BP0-BP3 to a high reference voltage Vrh, and the switches Sw20-Sw23 selectively connect the corresponding bottom-plate nodes BP0-BP3 to a low reference voltage Vrl. In this specification, it will be assumed that Vrl is at ground (i.e., 0V), Vrh is at the supply voltage VDD, Vcm is at VDD/2, and Vin can be at any voltage level from 0V to VDD. Those skilled in the art will understand that other implementations may involve different voltage levels for one or more of these analog signals.

The SAR ADC 100 has two operational phases: a sampling phase during which the input voltage Vin is sampled and electrical energy (in the form of charge) is stored in the storage capacitors Cs0-Cs3 and a conversion phase during which the stored energy in each of the storage capacitors Cs0-Cs3 is successively evaluated to generate the representative digital output value.

During the sampling phase, the sampling switches STP and Sin0-Sin3 are closed and the conversion switches Sw10-Sw13 and Sw20-Sw23 are open. As such, during the sampling phase, the top-plate node TP is driven to Vcm through the switch STP and the bottom-plate nodes BP0-BP3 are all driven to Vin through the switches Sin0-Sin3.

At the end of the sampling phase, the sampling switches STP and Sin0-Sin3 are all open, thereby (ideally) "freezing" the amount of energy (i.e., charge) stored in each of the storage capacitors Cs0-Cs3. As such, the voltage stored across each of the storage capacitors Cs0-Cs3 will (ideally) be fixed at the difference (Vcm-Vin) between the common-mode reference voltage Vcm and the input voltage Vin.

During the conversion phase, with the sampling switches STP and Sin0-Sin3 open, the conversion switches Sw10-Sw13 and Sw20-Sw23 are controlled to successively evaluate the energy stored in each of the storage capacitors Cs0-Cs3. During the conversion phase, depending on the voltage level of Vin during the sampling phase, the top-plate node TP will be driven somewhere between 0V and VDD. For example, when Vin=VDD, the node TP will be driven to 0V during the conversion phase; when Vin=VDD/2, the node TP will be driven to VDD/2 during the conversion phase; and, when Vin=0V, the node TP will be driven to VDD during the conversion phase.

It is known to implement the top-plate sampling switch STP using an n-type MOSFET (metal-oxide semiconductor, field-effect transistor) device, a p-type MOSFET device, or a transmission gate having an n-type MOSFET device and a p-type MOSFET device connected in parallel.

FIG. 2 is a schematic diagram of a conventional four-terminal, n-type MOSFET device 200 having a gate terminal G, a source terminal S, a drain terminal D, and a body (or bulk) terminal B. As indicated in FIG. 2, there is an inherent diode relationship between the drain terminal D and the body terminal B that ideally prevents current from flowing from the drain terminal D to the body terminal B. Similarly, there is an inherent diode relationship between the source terminal S and the body terminal B that ideally prevents current from flowing from the source terminal S to the body terminal B.

Nevertheless, when an actual device 200 is biased in the off/accumulation region, significant drain-to-body leakage current (a.k.a. GIDL) and significant source-to-body leakage current (a.k.a. GISL) can be observed, even for drain/source biases much lower than the device's breakdown voltage. The GIDL leakage current has a strong dependence on the drain-to-body voltage $V_{DB}$ and the drain-to-gate bias voltage $V_{DG}$. As $V_{DB}$ and/or $V_{DG}$ increases, the GIDL leakage current increases exponentially. Similarly, the GISL leakage current has a strong dependence on the source-to-body voltage $V_{SB}$ and the source-to-gate bias voltage $V_{SG}$. As $V_{SB}$ and/or $V_{SG}$ increases, the GISL leakage current increases exponentially.

Note that p-type MOSFET devices are also susceptible to GIDL and GISL leakage currents. For n-type devices, the GIDL leakage current is highest when the drain voltage reaches the highest voltage (i.e., VDD), and the GISL leakage current is highest when the source voltage reaches the highest voltage. For p-type devices, on the other hand, the GIDL leakage current is highest when the drain voltage reaches the lowest voltage (i.e., ground or zero volts), and the GISL current is highest when the source voltage reaches the lowest voltage. Note that, a transmission gate having both an n-type device and a p-type device will exhibit high GIDL/GISL leakage currents at both full-scale voltage and at zero voltage.

When the top-plate sampling switch STP of FIG. 1 is implemented using an n-type MOSFET device, like the device 200 of FIG. 2, the device's drain terminal D is connected to the reference voltage Vcm, the device's body terminal B is connect to ground, the device's source terminal S is connected to the top-plate node TP, and the device's gate terminal G is connected to control circuitry (not shown in FIG. 1) that turns on the device 200 (i.e., closes the switch STP) and turns off the device 200 (i.e., opens the switch STP).

During the conversion phase with the switch STP open, the top plate TP of the storage capacitor Cs is undriven. If there is any charge leakage, such as the charge leakage associated with GIDL and/or GISL leakage current, through the open switch STP, then the energy stored in the storage capacitors Cs0-Cs3 will change, which can adversely affect the accuracy of the digital output value generated by the ADC.

It would be advantageous to provide switch circuitry for the top-plate sampling switch STP of FIG. 1 that has reduced leakage current.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 1:
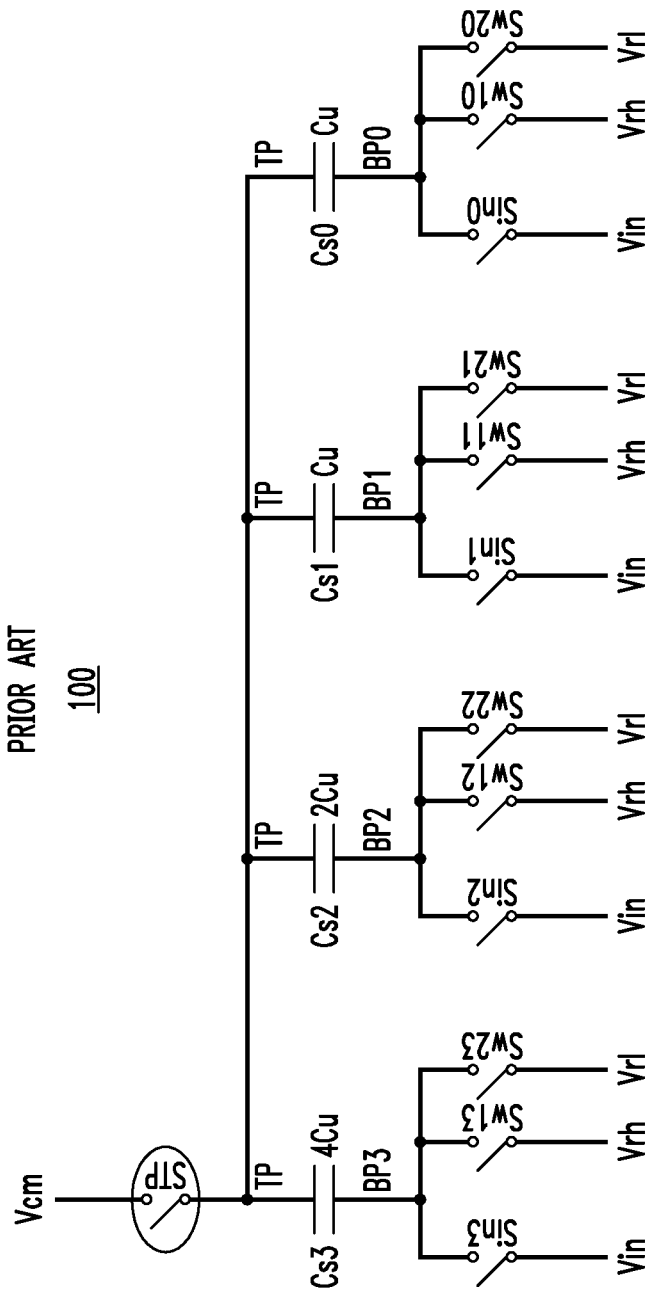
FIG. 1 is a schematic circuit diagram of a portion of a conventional 3-bit SAR ADC.
Figure 2:
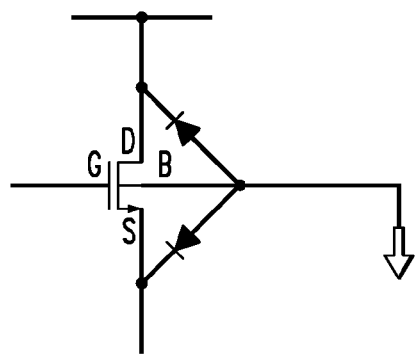
FIG. 2 is a schematic diagram of a conventional four-terminal, n-type MOSFET device.

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention comprises switch circuitry. The switch circuitry comprises a first transistor having a gate terminal, first and second channel terminals, and a body terminal; a second transistor having a gate terminal, first and second channel terminals, and a body terminal; and a first capacitor. The gates of the first and second transistors are interconnected; the first channel terminal of the second transistor is connected to the second channel terminal of the first transistor; and the first capacitor is connected across the first and second channel terminals of the second transistor.

The second transistor provides a first diode-voltage drop between the first and second channel terminals of the second transistor such that, when the first and second transistors are off and a positive, first voltage is applied to the second channel terminal of the second transistor, voltage at the second channel terminal of the first transistor is lower than the first voltage by the first diode-voltage drop, thereby reducing leakage current through the first transistor.

In one implementation, the first and second transistors are n-type devices, each having drain and source terminals as the first and second channel terminals, respectively, and the second transistor is configured as a forward-biased diode with its body terminal connected to its drain terminal. The switch circuitry further comprises a third n-type transistor having a gate terminal, a drain terminal, a source terminal, and a body terminal; and a second capacitor. The gates of the first, second, and third transistors are interconnected; the drain of the third transistor is connected to the source of the second transistor; the second capacitor is connected across the drain and source of the third transistor; and the third transistor is configured as a reverse-biased diode with its body connected to its drain.

In another implementation, the first and second transistors are p-type transistors, each having source and drain terminals as the first and second channel terminals, respectively; and the second transistor is configured as a reverse-biased diode with its body connected to its source.

In certain implementations, the switch circuitry further comprises a third transistor having a gate terminal, first and second channel terminals, and a body terminal; and a second capacitor. The gates of the first, second, and third transistors are interconnected; the first channel terminal of the third transistor is connected to the second channel terminal of the second transistor; and the second capacitor is connected across the first and second channel terminals of the third transistor.

The third transistor is configured to provide a second diode-voltage drop between the first and second channel terminals of the third transistor such that, when the first, second, and third transistors are off and a positive, second voltage is applied to the second channel terminal of the third transistor, voltage at the second channel terminal of the first transistor is lower than the second voltage by a sum of the first diode-voltage drop and the second diode-voltage drop, thereby reducing leakage current through the first transistor.

Figure 3:
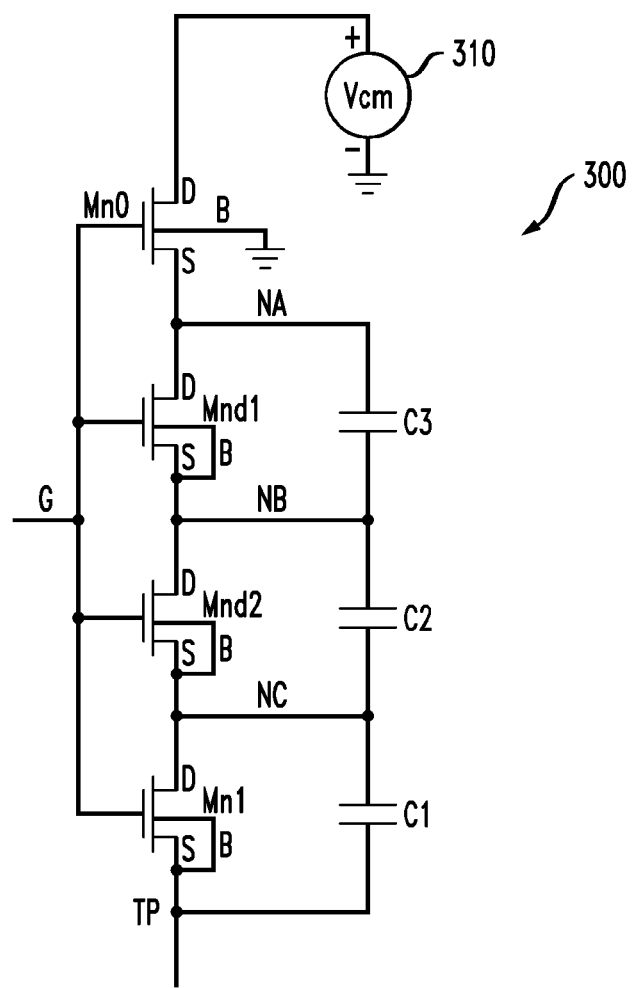
FIG. 3 is a schematic circuit diagram showing n-type switch circuitry that can be used to implement the top-plate sampling switch STP of FIG. 1, according to one embodiment of the present invention.

Referring now to FIG. 3, a schematic circuit diagram showing n-type switch circuitry 300 that can be used to implement the top-plate sampling switch STP of FIG. 1, according to one embodiment of the present invention, is shown. The switch circuitry 300 is connected between the common-mode (CM) reference voltage Vcm generated by CM voltage reference 310 and the top-plate node TP. Note that FIG. 3 does not show the storage capacitors Cs0-Cs3 and the other switches Sin0-Sin3, Sw10-Sw13, and Sw20-Sw23 of FIG. 1, but those elements would be part of an SAR ADC implemented using the switch circuitry 300.

The switch circuitry 300 comprises four gate-connected, n-type MOSFET devices Mn0, Mnd1, Mnd2, and Mn1 and three capacitors C1-C3. The body terminal B of the device Mn0 is connected to ground, the body terminal B of the device Mnd1 is connected to its source terminal S, the body terminal B of the device Mnd2 is connected to its source terminal S, and the body terminal B of the device Mn1 is connected to its drain terminal D. The capacitor C1 is connected across the source and drain terminals S and D of the device Mn1; the capacitor C2 is connected across the source and drain terminals S and D of the device Mnd2; and the capacitor C3 is connected across the source and drain terminals S and D of the device Mnd1.

When used in an SAR ADC, such as the SAR ADC 100 of FIG. 1, at the start of the ADC sampling phase, the switch circuitry 300 is closed by applying a sufficiently high voltage to the gate terminal G, which turns on the four devices Mn0, Mnd1, Mnd2, and Mn1 and allows energy to flow between the CM voltage reference 310 and the top plates of the storage capacitors Cs0-Cs3 and charge to accumulate in the storage capacitors Cs0-Cs3. The direction of the flow of energy and the corresponding sign of the accumulated charge will depend on the voltage-level difference (Vcm−Vin) between the CM reference voltage Vcm and the input voltage Vin.

At the end of the ADC sampling phase, the switch circuitry 300 is opened by applying a sufficiently low voltage to the gate terminal G, which turns off the four devices Mn0, Mnd1, Mnd2, and Mn1, to "freeze" the amount of energy stored in the storage capacitors Cs0-Cs3 for the ADC conversion phase.

Note that, in the conventional implementation of the SAR ADC 100 of FIG. 1, top-plate sampling switch STP would be implemented with only the device Mn0. As explained further below, the addition of the three devices Mnd1, Mnd2, and Mn1 and the three capacitors C1-C3 reduces the GIDL/GISL leakage currents that would otherwise adversely affect the performance of a SAR ADC implemented using only the device Mn0.

In the absence of the devices Mnd1, Mnd2, and Mn1 and the capacitors C1-C3, GIDL/GISL leakage currents through the device Mn0 can change the amount of energy stored in the storage capacitors Cs0-Cs3 and adversely affect the ADC performance. Because the body terminal B of the device Mnd1 is connected to the device's source terminal S, GIDL/GISL leakage currents through the device Mnd1 are reduced because the device's body and source terminals B and S are shorted together. As a result, the device Mnd1 acts as a forward-biased diode between the nodes NB and NA and provides a voltage drop Vt (from the node NB to the node NA) almost equal to the knee voltage of the diode.

When the voltage at the node NB is high, the voltage at the node NA will be lower by the diode-voltage drop Vt. This lower voltage at the node NA results in lower GIDL/GISL leakage currents through the device Mn0 since the voltage at the source terminal S of the device Mn0 is reduced due to the presence of the diode-configured device Mnd1. In some implementations, the presence of the diode-configured device Mnd1 reduces the GIDL/GISL leakage currents by a factor of approximately 5.

The presence of the similarly diode-configured device Mnd2 adds another forward-biased diode-voltage drop Vt between the voltage at the node NC and the voltage at the node NA, which further reduces the GIDL/GISL leakage currents through the device Mn0 by further reducing the voltage at the source terminal S of the device Mn0. In some implementations, the presence of both diode-configured devices Mnd1 and Mnd2 reduces the GIDL/GISL leakage currents by a factor of approximately 30.

The addition of devices Mnd1 and Mnd2 without the addition of device Mn1 would mean that the body terminal B of the device Mnd2 would be directly connected to the top-plate node TP. In that case, the top-plate node TP would see a large dynamic junction capacitance, which is undesirable due to reduced speed and increased non-linearity. To avoid that problem, the device Mn1 is included.

As shown in FIG. 3, the body terminal B of the device Mn1 is connected to the device's drain terminal D, not the device's source terminal S. As such, the top-plate node TP will not see a large dynamic capacitance.

Unlike the devices Mnd1 and Mnd2, during the off state of the switch circuitry 300 (i.e., when the switch circuitry 300 is open), the device Mn1 does not offer a forward-biased junction. Rather, the device Mn1 acts as a reverse-biased source-to-body diode. In some implementations, this is equivalent to adding a resistance of the order of tens of kilo-ohms in the path of the leakage current. But with leakage currents on the order of one nano-amp, the voltage drop across such resistance would be on the order of hundreds of micro-volts or at most about one milli-volt. Such a voltage drop would hardly cause any reduction in the leakage current, and the voltage at the source terminal S of the device Mnd2 would be substantially the same as the voltage at the top-plate node TP. The purpose of the device Md2 is to provide isolation between the body terminal of the device Md2 and the top-plate node TP.

As described above, the presence of the devices Mnd1, Mnd2, and Mn1 reduce the steady-state GIDL/GISL leakage currents through the device Mn0. If, during the ADC conversion phase, the top-plate node TP is driven to the supply voltage VDD, then the node NC will substantially be at the voltage VDD (due to the negligible voltage drop across the reverse-biased diode device Mn1), the node NB will be at the voltage (Vdd−Vt) (due to the voltage drop Vt across the forward-biased diode device Mnd2), and the node NA will be at the voltage (Vdd−2Vt) (due to the additional voltage drop Vt across the forward-biased diode device Mnd1). As a result, the voltage at the source terminal S of the device Mn0 will be 2Vt lower than it would be without the devices Mnd1, Mnd2, and Mn1 and, as a result, the GIDL/GISL leakage currents through the device Mn0 will be greatly reduced.

Significantly, however, without the capacitors C1-C3, problems could occur during transitions between the switch circuitry 300 being closed and the switch circuitry 300 being open that could adversely affect the accuracy of the SAR ADC operation.

During the ADC sampling phase with the switch circuitry 300 closed, the top-plate node TP, as well as all three intermediate nodes NA, NB, and NC, are driven to VDD/2. As explained previously, if Vin=0V, then, during the ADC conversion phase, the top-plate node TP will be driven to VDD. In that case, the node NA needs to be driven from VDD/2 to its steady-state conversion-phase voltage level of (VDD−2Vt), and the node NB needs to be driven from VDD/2 to its steady-state conversion-phase voltage level of (VDD−Vt). In the absence of the capacitors C1-C3, the charge needed to drive the nodes NA and NB to their steady-state conversion-phase voltage levels would come from the storage capacitors Cs0-Cs3, which would change the amount of stored energy and possibly thereby adversely affect the ADC digital output value.

In another situation, if Vin=VDD, then, during the ADC conversion phase, the top-plate node TP will be driven to 0V. Since node NC would have been driven to VDD/2 during the ADC sampling phase, driving the top-plate node TP to 0V during the ADC conversion phase would result in the body-source diode of the device Mn1 being forward biased. This would then become a major source of error. A forward-biased diode provides a significantly low resistance and thus could result in significant flow of current towards the node TP which would result in error.

Furthermore, if the gate-to-source capacitances Cgs of the devices Mn0, Mnd1, Mnd2, and Mn1 were significant in comparison to the parasitic capacitances on the nodes NA, NB, and NC, then the fall of the gate voltage from VDD to ground at the end of the ADC sampling phase would drive the nodes NA, NB, and NC to 0V or even below 0V. If the top-plate node TP (and therefore the source terminal of the device Mn1) were at VDD when the switch circuitry 300 is off, then the node NC (and therefore the body terminal of the device Mn1) being at or below 0V would cause the device Mn1 to leak excessively due to GIDL/GISL leakage currents, again possibly resulting in errors in the ADC digital output value.

Errors could also result if the voltage at one or both of nodes NA and NB were to fall below 0V. For example, if the voltage at node NA were to fall below 0V, then the body-source diode of the device Mn0 would tend to be forward-biased, and the device Mn0 would draw significant current and charge from the storage capacitors Cs0-Cs3, again jeopardizing the accuracy of the ADC digital output value.

The addition of the capacitors C1-C3 speeds up the transitions to the desired steady-state voltage levels when the switch circuitry 300 goes from on to off (i.e., from closed to open). During the ADC sampling phase when the switch circuitry 300 is closed, the nodes TP, NA, NB, and NC are all charged to VDD/2, and there is therefore no net charge stored in the capacitors C1-C3.

After the switch circuitry 300 is turned off, if, during the ADC conversion phase, the potential at the top-plate node TP is driven to VDD, then the nodes NA, NB, and NC will also be quickly driven towards VDD due to the capacitors C1-C3 all trying to remain at zero charge. Since the node NA (at or near voltage VDD) is closer to its steady-state voltage level of (VDD−2Vt), and the node NB (also at or near voltage VDD) is also closer to its steady-state voltage level of (VDD−Vt), the charge supplied by the storage capacitors Cs0-Cs3 to drive the nodes NA and NB to their respective steady-state voltage levels will be greatly reduced (compared to the situation without the capacitors C1-C3) and the adverse impact on the accuracy of the ADC digital output value will also be reduced if not completely avoided.

In another situation, after the switch circuitry 300 is turned off, if, during the ADC conversion phase, the potential at the top-plate node TP is driven to 0V, then the nodes NA, NB, and NC will also be quickly driven towards 0V, again due to the capacitors C1-C3 all trying to remain at zero charge. Here, too, the voltage levels at the nodes NA, NB, and NC will now be closer to their steady-state levels, any change in the energy stored in the storage capacitors Cs0-Cs3 to achieve those steady-state voltage levels will be minimal, and the adverse impact on the accuracy of the ADC digital output value will also be reduced or even completely avoided.

The capacitances of the capacitors C1-C3 should be selected such that they are able to balance out the Cgs capacitances of the devices Mn0, Mnd1, Mnd2, and Mn1. This would minimize the impact of coupling between the common gate terminal G and the nodes NA, NB, and NC, such that the nodes NA, NB, and NC would not fall to 0V when the gate terminal G is driven to 0V when the switch circuitry 300 is turned off.

Although the invention has been described in the context of n-type switch circuitry 300 of FIG. 3 which has four n-type MOSFET devices Mn0, Mnd1, Mnd2, and Mn1 and three capacitors C1-C3, the invention is not so limited. In other embodiments, n-type switch circuitry of the invention can have one or more additional forward-biased n-type MOSFET devices Mndi analogous to the devices Mnd1 and Mnd2 configured and connected in a similar manner between the device Mnd2 and Mn1, where each additional device Mndi would have a corresponding, additional capacitor analogous to capacitors C3 and C2, to provide even more GIDL/GISL leakage-current reduction.

In another embodiment, switch circuitry of the invention could be implemented by eliminating one of the devices Mnd1 and Mnd2 and its corresponding capacitor C3 or C2 with the remaining device Mnd1 or Mnd2 and its corresponding capacitor C3 or C2 connected directly to and between the device Mn0 on one side and the device Mn1 and the capacitor C1 on the other side.

In still other embodiments, switch circuitry of the invention can be implemented using p-type MOSFET devices instead of n-type MOSFET devices.

Figure 4:
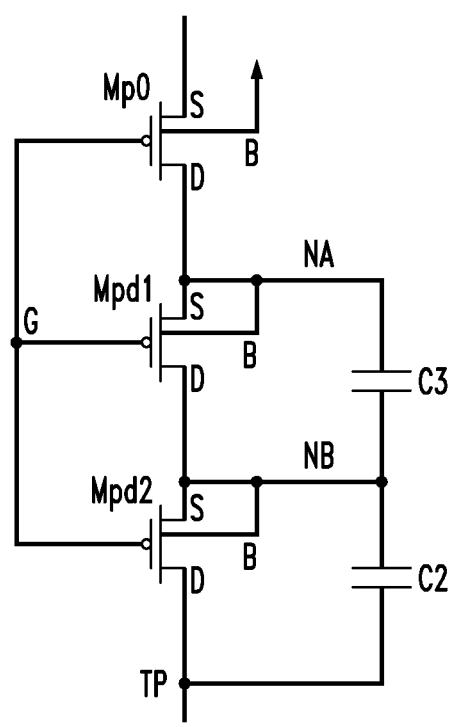
FIG. 4 is a schematic circuit diagram of p-type switch circuitry that can be used to implement the top-plate sampling switch STP of FIG. 1, according to another embodiment of the present invention.

FIG. 4 is a schematic circuit diagram of p-type switch circuitry 400, which includes p-type MOSFET devices Mp0, Mpd1, and Mpd2 and capacitors C2 and C3. The p-type device Mp0 of FIG. 4 is analogous to the n-type device Mn0 of FIG. 3; the p-type devices Mpd1 and Mpd2 of FIG. 4 are analogous to the n-type devices Mnd1 and Mnd2 of FIG. 3; and the capacitors C2 and C3 of FIG. 4 are analogous to the capacitors C2 and C3 of FIG. 3. Note that the switch circuitry 400 does not include components analogous to the device Mn1 and the capacitor C1 of FIG. 3.

As shown in FIG. 4, the body terminals B of the p-type devices Mp0, Mpd1, and Mpd2 are all connected to their source terminals S, such that all three devices are configured as forward-biased diodes. As such, the top-plate node TP is not directly connected to the body of any device, and that is why an isolation device (such as the device Mn1 of FIG. 3) is not needed in the p-type switch circuitry 400.

Note that, here, too, in alternative embodiments, p-type switch circuitry of the invention could have one or more additional p-type devices analogous to the devices Mpd1 and Mpd2 and one or more corresponding capacitors analogous to the capacitors C3 and C2 to provide even more GIDL/GISL leakage-current reduction. Similarly, other alternative embodiments could eliminate one of the devices Mpd1 or Mpd2 and its corresponding capacitor C3 or C2.

Note further that switch circuitry of the invention can be implemented as transmission gates that have both n-type devices and p-type devices.

Figure 5:
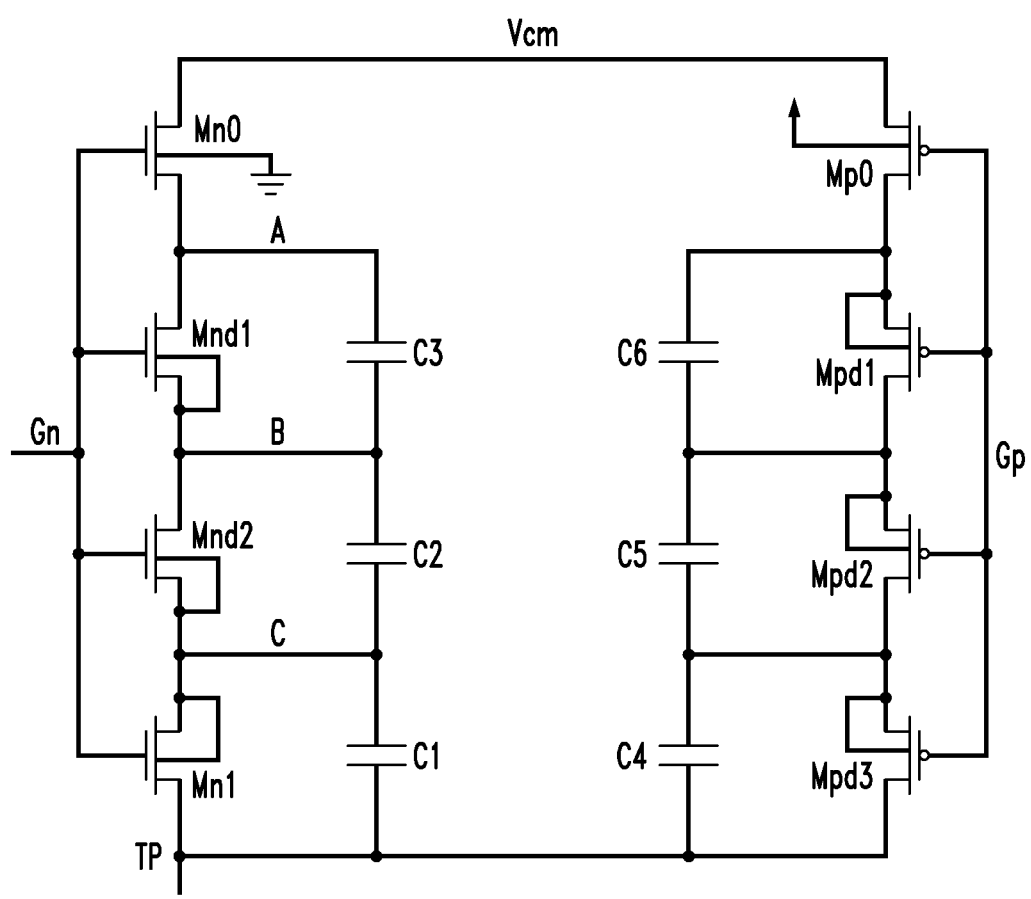
FIG. 5 is a schematic circuit diagram of transmission-gate switch circuitry that can be used to implement the top-plate sampling switch STP of FIG. 1, according to yet another embodiment of the present invention.

FIG. 5 is a schematic circuit diagram of transmission-gate switch circuitry 500, according to one embodiment of the invention. In this embodiment n-type devices Mn0, Mnd1, Mnd2, and Mn1 and capacitors C1-C3 are analogous to the similarly named components of FIG. 3. P-type devices Mp0, Mpd1, and Mpd2 are analogous to the similarly named components of FIG. 4, and capacitors C5 and C6 are analogous to capacitors C2 and C3 of FIG. 4. P-type device Mpd3 and capacitor M4 are an additional stage analogous to p-type devices Mpd1 and Mpd2 and their corresponding capacitors C5 and C6 of FIG. 5.

Although the invention has been described in the context of switch circuitry for SAR ADCs, the invention is not so limited. In general, switch circuitry of the invention can be used in any suitable application to reduce GIDL/GISL leakage currents, including other types of ADCs, Programmable Gain Arrays (PGAs), and any other suitable switch-cap circuit. Switch circuitry of the invention may be employed in a variety of different articles of manufacture including consumer electronics products, such as computers and telephones.

Unless explicitly stated otherwise, each numerical value and range should be interpreted as being approximate as if the word "about" or "approximately" preceded the value or range.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistor devices are typically shown as individual transistors for illustrative purposes. However, it is understood by those with skill in the art that transistor devices will have various sizes (e.g., gate width and length) and characteristics (e.g., threshold voltage, gain, etc.) and may consist of multiple transistors coupled in parallel to get desired electrical characteristics from the combination. Further, the illustrated transistor devices may be composite transistors.

As used in this specification and claims, the term "channel terminal" refers generically to either the source or drain of a MOSFET transistor device. Similarly, as used in the claims, the terms "source," "drain," and "gate" should be understood to refer respectively either to the source, drain, and gate of a MOSFET or to the emitter, collector, and base of a bi-polar device if an embodiment of the invention is implemented using bi-polar transistor technology.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture comprising switch circuitry comprising:
   a first transistor device having a gate terminal, first and second channel terminals, and a body terminal;
   a second transistor device having a gate terminal, first and second channel terminals, and a body terminal; and
   a first capacitor, wherein:
      the gate terminals of the first and second transistor devices are interconnected;
      the first channel terminal of the second transistor device is connected to the second channel terminal of the first transistor device;
      the first capacitor is connected across the first and second channel terminals of the second transistor device; and
      the second transistor device provides a first diode-voltage drop between the first and second channel terminals of the second transistor device such that, when the first and second transistor devices are off and a positive, first voltage is applied to the second channel terminal of the second transistor device, voltage at the second channel terminal of the first transistor device is lower than the first voltage by the first diode-voltage drop, thereby reducing leakage current through the first transistor device.

2. The article of claim 1, wherein:
the first and second transistor devices are n-type devices, each having drain and source terminals as the first and second channel terminals, respectively;
the second transistor device is configured as a forward-biased diode with its body terminal connected to its drain terminal;
the switch circuitry further comprises:
   a third n-type transistor device having a gate terminal, a drain terminal, a source terminal, and a body terminal; and
   a second capacitor, wherein:
      the gate terminals of the first, second, and third transistor devices are interconnected;
      the drain terminal of the third transistor device is connected to the source terminal of the second transistor device;
      the second capacitor is connected across the drain and source terminals of the third transistor device; and
      the third transistor device is configured as a reverse-biased diode with its body terminal connected to its drain terminal.

3. The article of claim 1, wherein:
the first and second transistor devices are p-type transistor devices, each having source and drain terminals as the first and second channel terminals, respectively; and
the second transistor device is configured as a reverse-biased diode with its body terminal connected to its source terminal.

4. The article of claim 1, wherein the switch circuitry further comprises:
   a third transistor device having a gate terminal, first and second channel terminals, and a body terminal; and
   a second capacitor, wherein:
      the gate terminals of the first, second, and third transistor devices are interconnected;
      the first channel terminal of the third transistor device is connected to the second channel terminal of the second transistor device;
      the second capacitor is connected across the first and second channel terminals of the third transistor device; and
      the third transistor device provides a second diode-voltage drop between the first and second channel terminals of the third transistor device such that, when the first, second, and third transistor devices are off and a positive, second voltage is applied to the second channel terminal of the third transistor device, voltage at the second channel terminal of the first transistor device is lower than the second voltage by a sum of the first diode-voltage drop and the second diode-voltage drop, thereby reducing leakage current through the first transistor device.

5. The article of claim 4, wherein:
the first, second, and third transistor devices are n-type transistor devices, each having drain and source terminals as the first and second channel terminals, respectively;

the second and third transistor devices are configured as forward-biased diodes with their body terminals connected to their drain terminals;
the switch circuitry further comprises:
a fourth n-type transistor device having a gate terminal, a drain terminal, a source terminal, and a body terminal; and
a third capacitor, wherein:
the gate terminals of the first, second, third, and fourth transistor devices are interconnected;
the drain terminal of the fourth transistor device is connected to the source terminal of the third transistor device;
the third capacitor is connected across the drain and source terminals of the fourth transistor device; and
the fourth transistor device is configured as a reverse-biased diode with its body terminal connected to its drain terminal.

6. The article of claim 4, wherein:
the first, second, and third transistor devices are p-type transistor devices, each having drain and source terminals as the first and second channel terminals, respectively; and
the second and third transistor devices are configured as reverse-biased diodes with their body terminals connected to their source terminals.

7. The article of claim 1, wherein the article comprises an analog-to-digital converter (ADC) comprising the switch circuitry connected between an ADC voltage reference and ADC storage capacitors.

8. The article of claim 7, wherein the ADC is a successive-approximation-register (SAR) ADC.

9. The article of claim 1, wherein the article of manufacture is an electronics product comprising the switch circuitry.

* * * * *